United States Patent
Kim

(10) Patent No.: US 9,269,433 B2
(45) Date of Patent: Feb. 23, 2016

(54) RESISTIVE MEMORY DEVICE AND WRITE METHOD THEREOF

(71) Applicant: SK HYNIX INC., Icheon (KR)

(72) Inventor: Kyu Sung Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 130 days.

(21) Appl. No.: 13/945,234

(22) Filed: Jul. 18, 2013

(65) Prior Publication Data

US 2014/0177320 A1 Jun. 26, 2014

(30) Foreign Application Priority Data

Dec. 24, 2012 (KR) .................. 10-2012-0152191

(51) Int. Cl.
*G11C 13/00* (2006.01)

(52) U.S. Cl.
CPC ........ *G11C 13/0069* (2013.01); *G11C 13/0007* (2013.01); *G11C 13/0064* (2013.01); *G11C 2013/0073* (2013.01)

(58) Field of Classification Search
USPC .......................................... 365/148
See application file for complete search history.

(56) References Cited

U.S. PATENT DOCUMENTS

| | | | |
|---|---|---|---|
| 7,411,815 B2 | 8/2008 | Gogl | |
| 2006/0221734 A1* | 10/2006 | Bedeschi et al. | 365/201 |
| 2010/0220513 A1* | 9/2010 | Kim et al. | 365/148 |
| 2012/0120711 A1* | 5/2012 | Rabkin et al. | 365/148 |
| 2012/0300531 A1* | 11/2012 | Huang et al. | 365/148 |
| 2013/0094275 A1* | 4/2013 | Chen | G11C 11/00 365/148 |
| 2014/0169066 A1* | 6/2014 | Ramaswamy et al. | 365/148 |

* cited by examiner

*Primary Examiner* — Min Huang

(57) ABSTRACT

A method writes data in a resistive memory device in which paths for performing write operations to record first-state data and second-state data are controlled to cause current to flow in opposing directions in a resistive memory cell whose switching type has been determined. The method includes performing a write operation in a predetermined direction when writing the first-state data and second-state data, making a determination with respect to success in target data through verification, and attempting an additional write operation through a path reversed from a write path of corresponding data according to a result of the determination.

20 Claims, 4 Drawing Sheets

Type 1 : +RESET,-SET

Type 2 : +SET,-RESET

RESISTIVE MEMORY DEVICE AND WRITE METHOD THEREOF

CROSS-REFERENCES TO RELATED APPLICATION

The present application claims priority under 35 U.S.C. §119(a) to Korean application number 10-2012-0152191, filed on Dec. 24, 2012, in the Korean Intellectual Property Office, which is incorporated herein by reference in its entirety.

BACKGROUND

1. Technical Field

The present invention relates to a resistive memory device and a write method thereof.

2. Related Art

Recently, studies have been conducted on next-generation memory devices that can serve as substitutes for existing memory devices such as dynamic random access memory (DRAM) devices and flash memory devices. One next-generation memory device is a resistive random access memory (ReRAM) device that uses a resistive material capable of switching between two or more different resistance states by a sharp variance of resistances in response to an applied bias voltage.

The resistance of a variable resistance material layer of a ReRAM device reversibly changes according to the polarity or amplitude of a pulse applied thereto.

In addition, the ReRAM device may operate in a unipolar switching manner or a bipolar switching manner according to polarities of voltages applied in a set operation and a reset operation.

FIG. 1a and FIG. 1b are hysteresis curves showing a bipolar switching operation of a typical resistive memory device.

FIG. 1a and FIG. 1b show a positive switching manner and a negative switching manner, respectively, in a bipolar switching operation of a resistive memory device. In FIG. 1a and FIG. 1b, an X axis represents voltage, and a Y axis represents current.

In the hysteresis curve of FIG. 1a, while increasing a positive voltage, cell data is defined as reset data if it is sensed that the cell has a high resistance state and defined as set data if it is sensed that the cell has a low resistance state, with respect to a predetermined voltage. The directions of the arrows show that there are two paths for data writing.

In the hysteresis curve of FIG. 1b, while increasing a negative voltage, cell data is defined as set data if it is sensed that the cell has a high resistance state and defined as set data if it is sensed that the cell has is a low resistance state, with respect to a predetermined voltage. Similar to FIG. 1a, in FIG. 1b paths for data writing appear to have two directions.

FIG. 1a and FIG. 1b illustrate the bipolar manner in which a bidirectionally reversible reaction is possible as described above. As shown in FIGS. 1a and 1b, an operation can be performed between a set state and a reset state at a predetermined threshold voltage.

Therefore, when designing a cell structure, it is first determined whether the resistance reference of the cell is defined in a positive-reset and negative-set manner or in a negative-reset and positive-set manner. Then a type of write driver is selected according to the result of the determination.

However, characteristics of a cell may vary depending on process, voltage, and temperature (PVT) conditions of a cell manufacturing process, cell operation conditions, or ambient environments. As a result, even if all circuit conditions and schemes are designed in a positive switching manner, a specific cell may still exhibit negative switching characteristics as its threshold voltage deviates from a predetermined threshold voltage, which may cause errors in a data writing operation.

SUMMARY

Embodiments of the present invention are directed to a resistive memory device and a write method thereof.

In accordance with an embodiment of the present invention, a write method of a resistive memory device, in which paths for performing write operations to record first-state data and second-state data are mutually differently controlled, includes: performing a write in a predetermined direction when writing the first-state data and second-state data, and then making a determination with respect to success in target data through verification; and attempting a write through a path reversed from a write path of corresponding data according to a result of the determination.

In accordance with another embodiment of the present invention, a write method of a resistive memory device, in which first-state data is established to be processed through a first write path, and second-state data is established to be processed through a second write path, includes: performing a write of the first-state data through the first write path, and making a verification; performing a write of the second-state data through the second write path, and making a verification; sensing that a characteristic of a resistive memory cell has been reversed when the first-state data has not been acquired in the verification step, and performing an additional write according to a sensed result; and sensing that the characteristic of the resistive memory cell has been reversed when the second-state data has not been acquired in the verification step, and performing an additional write according to a sensed result.

In accordance with still another embodiment of the present invention, a write method of a resistive memory device, in which a write of set data is performed with current flowing from a row to a column which are coupled to a resistive memory cell, and a write of reset data is performed with current flowing from a column to a row which are coupled to the resistive memory cell, includes: performing a write to flow current from the column to the row in order to acquire the set data when it is sensed that a characteristic of the resistive memory cell has been reversed; and performing a write to flow current from the row to the column in order to acquire the reset data when it is sensed that a characteristic of the resistive memory cell has been reversed.

In accordance with further still another embodiment of the present invention, a resistive memory device includes: a first write driver configured to process first-state data through a first write path; and a second write driver configured to process second-state data through a second write path, wherein: current is applied to the second write path to perform an additional write when it is determined in verification that the first-state data has not been acquired through the first write driver; and current is applied to the first write path to perform an additional write when it is determined in verification that the second-state data has not been acquired through the second write driver.

Embodiments of the present invention relate to a resistive memory device and a write method thereof having high reliability, which can reduce errors or malfunctions although a characteristic of a cell is changed.

BRIEF DESCRIPTION OF THE DRAWINGS

Features, aspects, and embodiments are described in conjunction with the attached drawings, in which.

DETAILED DESCRIPTION

Hereinafter, a resistive memory device and a write method thereof according to embodiments of the present invention will be described with reference to the accompanying drawings.

Figure 1A:
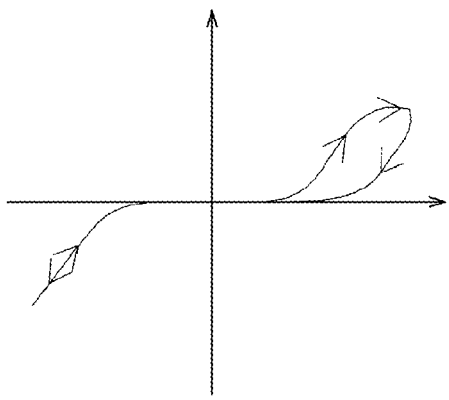
FIGS. 1a and 1b are hysteresis curves showing a bipolar switching operation of a conventional resistive memory device.
Figure 1B:
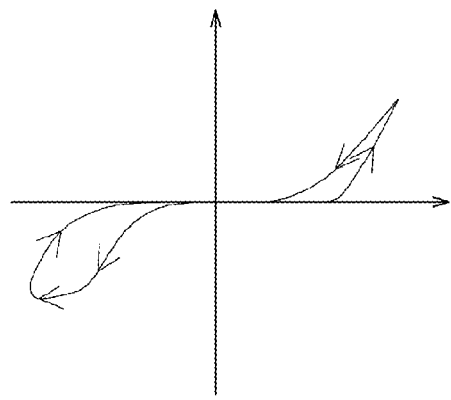
Figure 2:
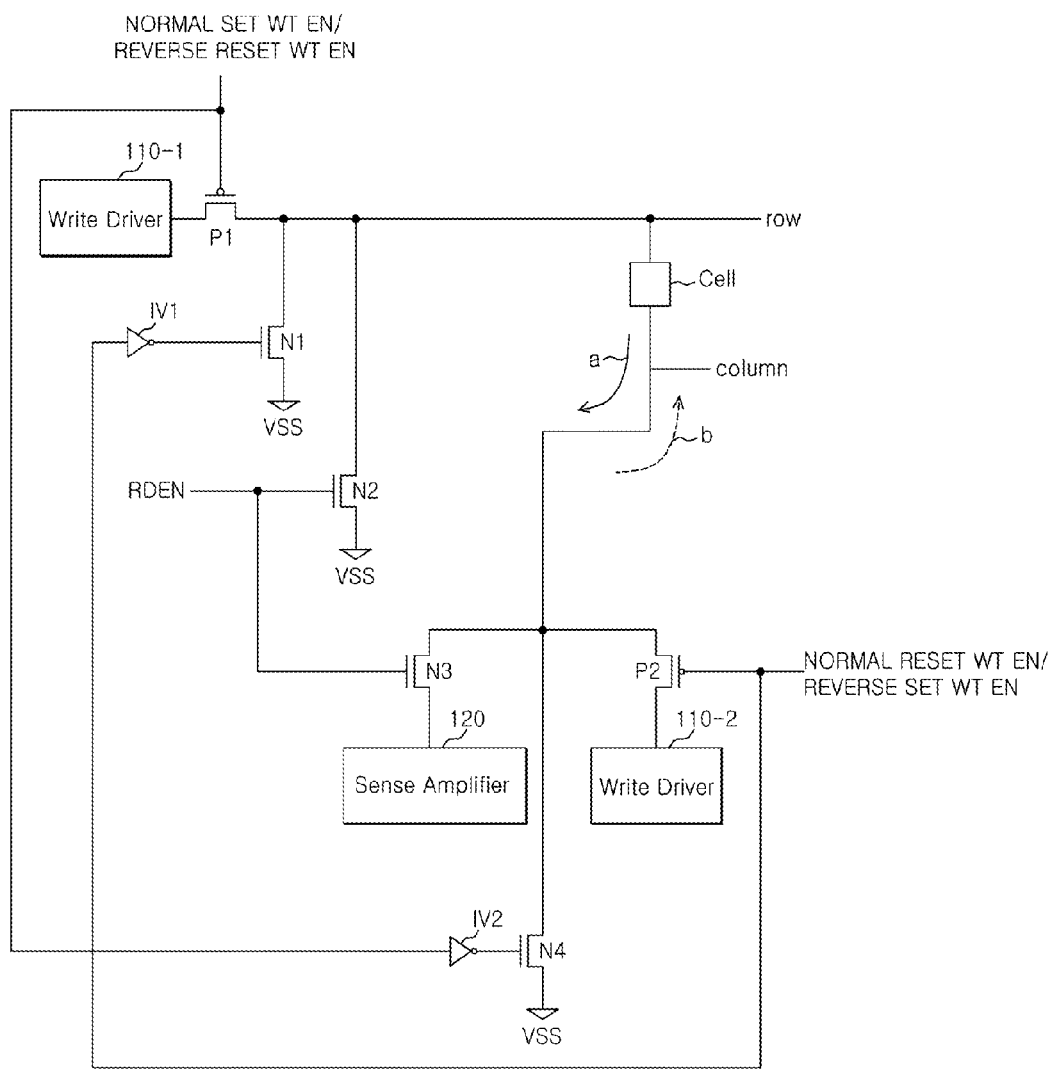
FIG. 2 illustrates a resistive memory device according to an embodiment of the present invention.

FIG. 2 illustrates a resistive memory device according to an embodiment of the present invention.

Referring to FIG. 2, the resistive memory device includes a first write driver 110-1, a second write driver 110-2, a sense amplifier 120, and a cell.

In an embodiment, the first and second write drivers 110-1 and 110-2 are the same type of drivers, and are included for bidirectional switching in a write operation.

For convenience of description, a resistive memory device according to an embodiment of the present invention will be illustrated with reference to a memory device having a cell type with a positive switching manner. Accordingly, cell characteristics and circuit schemes of the memory device are designed to define the resistance reference of a cell in a positive-reset and negative-set manner.

However, in accordance with another embodiment of the present invention, the cell type may have a negative switching manner. In addition, those skilled in the art will recognize that variations and modifications of cell characteristics and circuit schemes from those shown and described with reference to FIG. 2 are possible in various embodiments of the present invention.

Similar to a typical resistive memory device, the resistive memory device according to an embodiment of the present invention includes a resistive memory cell coupled to and disposed between a row line and a column line.

A more detailed description of the resistive memory device will be given hereinafter.

A first PMOS transistor P1 includes a gate that receives a predetermined write instruction (for example, write control signal), a source coupled to the first write driver 110-1, and a drain coupled to a first NMOS transistor N1, a second NMOS transistor N2, and a row line.

A second PMOS transistor P2 includes a gate that receives a predetermined write instruction (for example, write control signal), a source coupled to the second write driver 110-2, and a drain coupled to a third NMOS transistor N3, a fourth NMOS transistor N4, and a column line.

Each of the second NMOS transistor N2 and the third NMOS transistor N3 is configured to respond to a read enable signal RDEN.

The circuit shown in FIG. 2 illustrates an exemplary circuit to explain an operation of the resistive memory device. However, one of skill in the art will recognize that the specific configuration of a circuit may vary in accordance with an embodiment of the present invention. In addition, the configuration of the circuit shown in FIG. 2 is not intended to limit the scope of the present invention.

A memory cell included in the resistive memory device may include an access element (not shown) and a resistive memory element (not shown). The resistive memory element (not shown) may include an upper electrode (not shown), a lower electrode (not shown), and a variable resistance maternal layer provided between the upper and lower electrodes.

The variable resistance material layer may include a material having an electrical resistance that varies depending on oxygen vacancy or movement of ions. For example, the variable resistance material layer may include: perovskite-based material such as $SrTiO_3$ (STO), $BaTiO_3$ (BTO), $Pr_{1-x}Ca_xMnO_3$ (PCMO), or the like; or binary oxide including transition metal oxide (TMO), such as titanium oxide ($TiO_2$ or $Ti_4O_7$), hafnium oxide ($HfO_2$), zirconium oxide ($ZrO_2$), aluminum oxide ($Al_2O_3$), tantalum oxide ($Ta_2O_5$), niobium oxide ($Nb_2O_5$), cobalt oxide ($Co_3O_4$), nickel oxide (NiO), tungsten oxide ($WO_3$), lanthanum oxide ($La_2O_3$), or the like. In addition, the variable resistance material layer may include a material having an electrical resistance that varies depending on phase transformation. The variable resistance material layer may include a material that transforms into a crystalline or amorphous state by heat, for example, a chalcogenide-based material such as GeSbTe (GST) in which germanium, antimony, are tellurium are combined at a predetermined ratio.

Each of the upper and lower electrodes may include a conductive material, such as metal nitride including titanium nitride (TiN), tantalum nitride (TaN), tungsten nitride (WN), or the like, metal including tungsten (W), aluminum (Al), copper (Cu), gold (Au), silver (Ag), platinum (Pt), nickel (Ni), chromium (Cr), cobalt (Co), titanium (Ti), ruthenium (Ru), hafnium (Hf), zirconium (Zr), or the like, doped polysilicon, or the like.

In the memory cell illustrated in FIG. 2, when writing first-state data, e.g., a logic value "1", current is applied in a first direction "a". When writing second-state data, e.g., a logic value "0", current is applied in a second direction "b". That is to say, in a resistive RAM device in which data writing is performed in two directions, write operations to record first-state data and second-state data are performed so that current flows in two opposing directions.

The first direction "a" is defined as a current path through which current flows from the row line to the column line via the memory cell in response to a voltage applied to the row line. Here, the first direction "a" will be referred to as a first write path.

The second direction "b" is defined as a current path through which current flows from the column line to the row line via the memory cell in response to a voltage applied to the column line. Here, the second direction "b" will be referred to as a second write path.

If data is written through the first write path, a resistive memory element of the memory cell has a low resistance value. On the other hand, if data is written through the second write path, the resistive memory element of the memory cell has a high resistance value.

In addition, in a read operation, the sense amplifier 120 operates in response to an activated read enable signal RDEN, and determines whether corresponding data is set data or reset data by sensing the resistance state of the memory cell.

In more detail, if the read enable signal RDEN is activated by a read instruction, the second NMOS transistor N2 and third NMOS transistor N3 are turned on. Through current flows from the memory cell to the second NMOS transistor N2, and simultaneously, a current path from the memory cell to the sense amplifier 120 is activated. Thus, the sense amplifier 120 senses current of the column line, which changes depending on the resistance state of the memory cell, when the through current flows from the memory cell to the second NMOS transistor N2, thereby sensing data stored in the memory cell.

That is to say, the read operation is achieved in such a manner as to sense current, which flows through a current path formed between the sense amplifier 120 and the memory cell and changes depending on the resistance state of the memory cell, while the through current flows from the memory cell to the second NMOS transistor N2. The sensed current varies depending on whether the memory cell is in the set state of "1" or in the reset state of "0". That is, the amount of sensed current is small due to a high resistance value when the memory cell is in the reset state, and is large due to a low resistance value when the memory cell is in the set state. The sense amplifier 120 compares the amount of the sensed current with the amount of a reference current, and thus can read the data stored in the memory cell.

If a write instruction is inputted to write data of the set state, the write operation is performed in the direction of "a". That is to say, if a set data write instruction is provided, the first PMOS transistor P1 is turned on in response to the set data write instruction, and thus the first write driver 110-1 is activated. The set data write instruction also turns on the fourth NMOS transistor N4 via a second inverter IV2. Accordingly, as current flows through the memory cell in the direction of "a", the resistance state of the memory cell gradually changes until a predetermined target value is reached, so that the memory cell has a low resistance value. As a result, the set data is written in the memory cell.

On the other hand, if a write instruction is inputted to write data of the reset state, the write operation is performed in the direction of "b". That is to say, if a reset data write instruction is provided, the second PMOS transistor P2 is turned on in response to the reset data write instruction, and thus the second write driver 110-2 is activated. At the same time, the first NMOS transistor N1 is turned on in response to an inverted reset data write instruction that is provided via a first inverter IV1, so that current flows through the memory cell in the direction of "b". Accordingly, the resistance state of the memory cell gradually changes to a high resistance until the resistance value of the memory cell reaches a predetermined target value. As a result, the reset data is written in the memory cell.

The aforementioned write operation is substantially the same as that of a typical resistive memory device.

However, in a resistive memory device according to an embodiment of the present invention, in order to improve the reliability of the memory device when the characteristics of the memory cell are different from other memory cells in the memory device, the first and second write drivers 110-1 and 110-2 of the same type can be controlled to operate to compensate for the different characteristics of the memory cell.

That is, the first and second write drivers 110-1 and 110-2 are configured not only to respond to the set data write instruction and the reset data write instruction, respectively, but also, if the write operation of the set data or reset data ends in a failure, to sense reversed characteristics of the memory cell and perform an additional write operation on the memory cell in a reversed direction, e.g., in the opposite direction of the normal direction of "a" or "b".

If the set data is target data that is supposed to be written in the memory cell, the write operation is first performed in the direction of "a", i.e., the first direction, using the first write driver 110-1. After that, if it is determined that the set data has not been written in the memory cell through data verification, i.e., if it is sensed that the characteristics of the memory cell are reversed, the second write driver 110-2 is controlled to write data in the direction of "b", i.e., the second direction, so as to write the set data in the memory cell.

If the reset data is target data that is supposed to be written in the memory cell, the write operation is first performed in the direction of "b", i.e., the second direction, using the second write driver 110-2. After that, if it is determined that the reset data has not been written in the memory cell through the data verification, i.e., if it is sensed that the characteristics of the memory cell are reversed, the first write driver 110-1 is controlled to write data in the direction of "a", i.e., the first direction, so as to write the reset data in the memory cell.

The driving circuits of a memory device are generally configured based on one type of cell switching, and do not provide another circuit to write data in a reversed scheme when the characteristics of the memory cell have been reversed. However, according to an embodiment of the present invention, for example, if the characteristics of the memory cell change and thus the writing of the reset data fails, the write operation is performed in a direction, e.g., the direction of "a", that is opposite to a direction, e.g., the direction of "b", for writing the reset data in a normal cell in the memory device. As a result, the memory cell can acquire a high resistance state, i.e., the reset data, through the write path of the direction of "a".

On the other hand, if set data is to be written in the memory cell, the write operation is performed in the direction of "a". However, if the characteristics of the memory cell change and writing the set data in the direction "a" fails, an operation for acquiring the set data, which corresponds to a low resistance state, from the memory cell is performed in the direction of "b".

According to an embodiment of the present invention, although a write driver is configured based on one type of cell switching, instead of using two different types of write drivers, the path for writing data in a cell is selectively controlled so that it can be reversed using the bipolar characteristics of the cell. As a result, it is possible to compensate for the change in the characteristics of the cell and thus to increase the reliability of data.

Next, a more detailed operation of the memory device shown in FIG. 2 will be described with reference to a flow-chart of FIG. 3.

Figure 3:
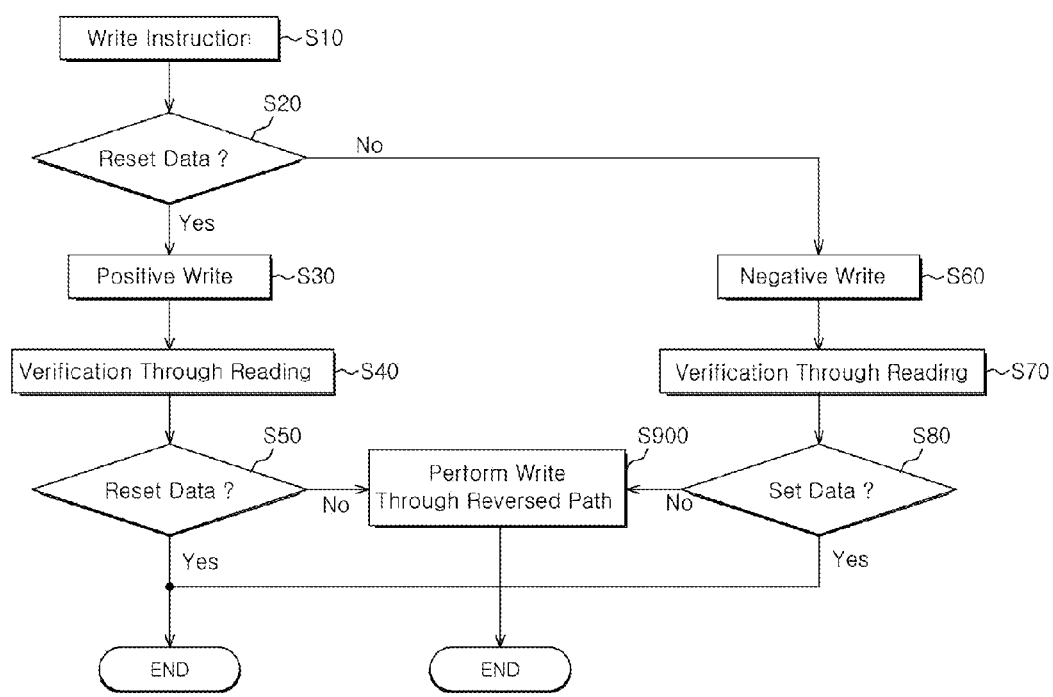
FIG. 3 is a flowchart illustrating an operation of the resistive memory device shown in FIG. 2 according to an embodiment of the present invention.

Referring to FIG. 3, a write instruction is provided to perform a write operation in step S10. After that, it is determined whether reset data or set data is to be written in the memory cell in step S20.

If reset data is to be written in the memory cell, the write operation is performed in the second direction, i.e., the direction of "b", in step S30. That is to say, a positive voltage is applied to the column line, and thus current flows from the column line to the row line.

After a predetermined time period elapses, data verification is performed by reading the data written in the memory cell in step S40.

Then it is determined whether or not desired target data, i.e., the reset data, is written in the memory cell in step S50. If it is determined that the reset data is written in the memory cell, the write operation is completed (END). On the other hand, if it is determined that the reset data has not been obtained, a write operation is performed again through a reversed path, i.e., in the direction of "a", in step S900.

Similarly, in an embodiment, if it is determined that the set data is to be written in the memory cell in step S20, the write operation is performed in the first direction, i.e., the direction of "a", in step S60. That is to say, a positive voltage is applied to the row line, and thus, current flows from the row line to the column line.

After a predetermined time period elapses, data verification is performed by reading the data written in the memory cell in step S70.

After that, it is determined whether or not desired target data, i.e., the set data, is written in the memory cell in step S80. If it is determined that the set data is written in the memory cell, the write operation is completed (END). On the other hand, if it is determined that the set data has not been obtained, a write operation is performed again through a reversed path, i.e., in the direction of "b", in step S900.

Figure 4:
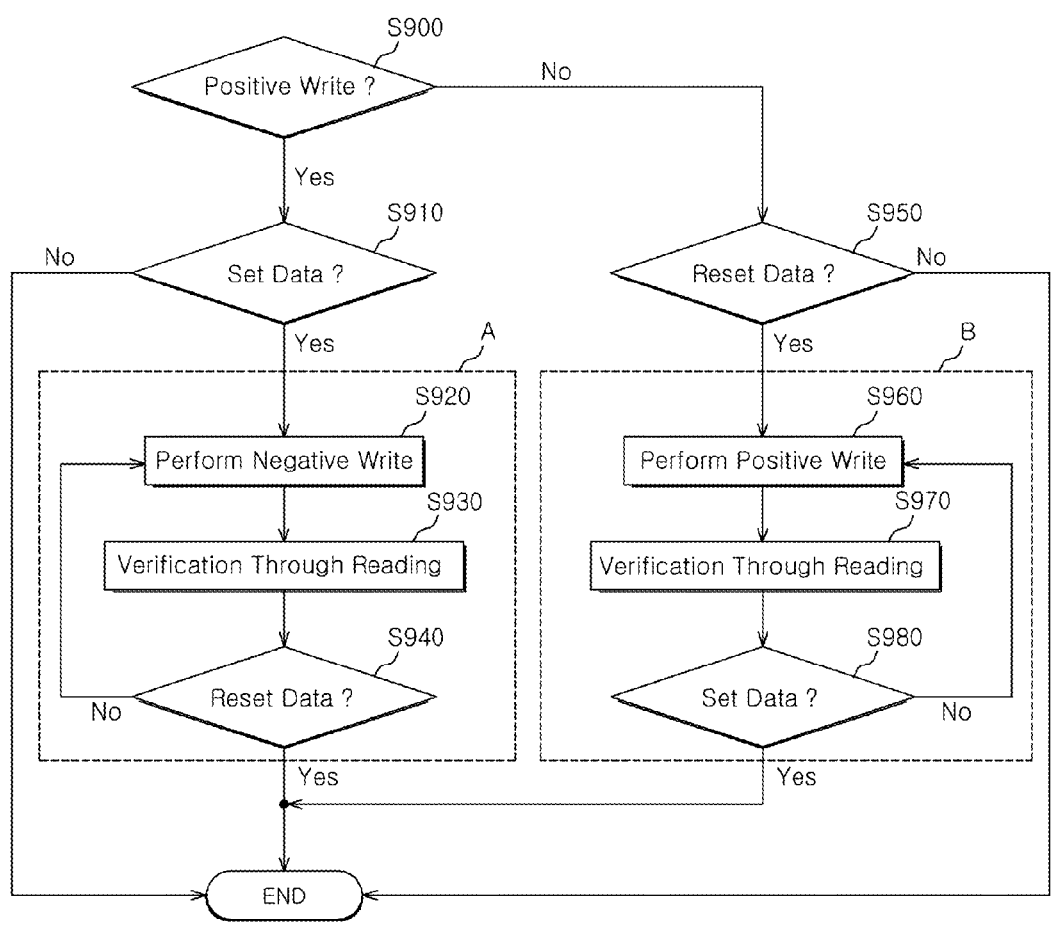
FIG. 4 is a detailed flowchart illustrating an operation of the resistive memory device shown in FIG. 2 according to an embodiment of the present invention.

FIG. 4 is a flowchart illustrating a method of performing a write operation through a reversed path in accordance with an embodiment of the present invention.

Referring to FIG. 4, if the writing operation performed through a preset write path fails, it is determined that the characteristics of the memory cell are reversed. Accordingly, a write operation is performed again through a reversed write path.

In step S900, whether or not the preset write path is a positive write path is determined to apply a positive voltage to the column line. That is, whether the reset data is to be written in the memory cell is determined. If a positive voltage is to be applied to the column line to write the reset data, it is then determined whether or not the set data is written in the memory cell through the write path for the reset data in step S910. If it is determined that the set data is written in the memory cell, then the characteristics of the memory cell have been reversed. Accordingly, the memory cell is regarded as a cell type with a negative switching manner because of the reversed characteristics thereof. Thus, a write path of the memory cell is reversed. That is to say, in order to obtain the reset data, a write operation is performed on the memory cell while driving the first write driver 110-1 so that current flows from the row line to the column line in step S920.

After a predetermined time period elapses, data verification is performed through reading the memory cell in step S930.

After that, in step S940, it is determined whether or not the reset data is written in the memory cell based on the result of the verification. If it is determined that the reset data is written in the memory cell, the write operation is completed (END). On the other hand, if it is determined that the reset data has not yet been written in the memory cell, the write operation "A", i.e., the processes of S920 to S940, is repeatedly performed in the first direction, i.e., the direction of "a".

However, if, in step S900, it is determined that the positive voltage is not applied to the column line to write the reset data, i.e., a negative voltage is applied to the column line, whether or not the reset data is written in the memory cell is determined in step S950. If the reset data is written in the memory cell, it means the characteristics of the memory cell have been reversed because the set data is normally written in the memory cell through a write path of applying the negative voltage to the column line. Thus, the memory cell is regarded as having a negative switching manner, and the write path is reversed. That is, in order to obtain the set data, a write operation is performed on the memory cell while driving the second write driver 110-2 so that current flows from the column line to the row line in step S960.

After a predetermined time period elapses, data verification is performed through reading on the memory cell in step S970.

Then, it is determined whether the set data is written in the memory cell based on the verification result in step S970. If it is determined that the set data is written in the memory cell, the write operation is completed (END). On the other hand, if it is determined that the set data has not yet been written in the memory cell, the write operation "B", i.e., the processes of S960 to S980, is repeatedly performed in the second direction, i.e., the direction of "b".

In other words, according to an embodiment of the present invention, although a cell is initially determined as having one type of switching, if the characteristics of the cell are changed due to certain environments or manufacturing conditions, it is sensed that the characteristics of the cell are reversed, and then a write operation is performed on the cell in the opposite direction of a normal write path for writing target data in the cell, instead of changing a type of a write driver.

Accordingly, as described above, if a write operation, which is performed in the first direction to write set data in the cell, has failed, an additional write operation is attempted on the cell in the second direction to acquire the set data. On the other hand, if a write operation performed in the second direction to write reset data in the cell has failed, an additional write operation is attempted on the cell in the first direction to acquire the reset data.

In other words, in accordance with an embodiment of the present invention, a write operation is performed so that current flows from a column line to a row line in order to write set data in a cell if it is sensed that the characteristics of the cell have been reversed, and a write operation is performed so that current flows from the row line to the column line in order to write reset data if it is sensed that the characteristics of the cell have been reversed. As a result, it is possible to cope with a change in the characteristics of the cell without using an additional write driver.

To implement the above operations, each of the first and second write drivers 110-1 and 110-2 is configured to respond to a reverse path write instruction if a normal write operation is failed in addition to a normal preset write instruction. For example, a determination unit for determining whether or not a write operation has been successfully performed, a cell characteristic change sensing unit, a control unit for selectively providing an additional write instruction, and so on may also be included. Implementation of such elements can be understood and applied by a person skilled in the art, and thus a detailed description thereof will be omitted.

Therefore, according to embodiments of the present invention, if the inherent physical characteristics of a cell are reversed due to certain environments, a write path is reversed so that data is written in the cell in order to obtain target data. As a result, it is possible to implement a resistive memory device having high reliability.

While certain embodiments have been described above, it will be understood to those skilled in the art that the embodiments described are by way of example only. Accordingly, methods and devices described herein should not be limited based on the described embodiments. Rather, methods and devices described herein should only be limited in light of the claims that follow when taken in conjunction with the above description and accompanying drawings.

What is claimed is:

1. A method of writing data in a resistive memory device, the method comprising:
    performing a write operation on a cell through one of first and second write paths to write target data of first-state data and second-state data;
    determining whether or not the target data is written in the cell through data verification; and
    performing an additional write operation on the cell through a write path different from the write path used in the write operation to write the target data when it is determined that the target data has not been written in the cell, wherein the data verification is performed by comparing a reference current with a current sensed according to data stored in the cell.

2. The method according to claim 1, wherein, if a write operation for the first-state data is failed, an additional write operation is performed through the second write path.

3. The method according to claim 1, wherein, if a write operation for the second-state data is failed, an additional write operation is performed through the first write path.

4. The method according to claim 1, wherein the first write path for writing the first-state data and the second write path for writing the second-state data are controlled in response to different control signals.

5. The method according to claim 1, wherein the first write path is in a direction opposite to the second write path.

6. The method according to claim 5, wherein, in the first write path, current flows from a row line to a column line between which the cell is disposed, and, in the second write path, current flows from the column line to the row line.

7. The method according to claim 1, wherein the first-state data is set data, and the second-state data is reset data.

8. A method of writing data in a resistive memory device, the method comprising:
performing a write operation to write target data of first-state data and second-state data in a cell through a corresponding one of first and second write paths,
wherein the first-state data is written in the cell through the first write path, and the second-state data is written in the cell through the second write path that is opposite to the first write path;
verifying whether or not the target data is written in the cell to determine whether or not a characteristic of the cell is reversed, by comparing a reference current with a current sensed according to data stored in the cell; and
performing an additional write operation on the cell through a write path different from the write path used in the write operation to write the target data when the target data has not been written in the cell.

9. The method according to claim 8, wherein, if the target data is the first-state data, in performing the additional write operation on the cell, current is controlled to flow through the second write path.

10. The method according to claim 8, wherein, if the target data is the second-state data, in performing the additional write operation on the cell, current is controlled to flow through the first write path.

11. The method according to claim 8, wherein, in the first write path, current flows from a row line to a column line between which the cell is disposed, and, in the second write path, current flows from the column line to the row line.

12. The method according to claim 8, wherein the first-state data is set data, and the second-state data is reset data.

13. A resistive memory device, comprising:
a first write driver configured to drive a first write path to write first-state data in a cell; and
a second write driver configured to drive a second write path to write second-state data in the cell,
wherein, when it is determined in a verification operation of the cell that target data of the first-state data the second-state data has not been written in the cell in an original write operation, in an additional write operation, the first write driver and the second write driver are selectively controlled to apply current to the cell through a write path different from the write path used in the original write operation, and
wherein the verification operation is performed by comparing a reference current with a current sensed according to data stored in the cell.

14. The resistive memory device according to claim 13, wherein the first-state data corresponds to set data, and the second-state data corresponds to reset data.

15. The resistive memory device according to claim 13, wherein the first write path forms a current path from a row line to a column line between which the cell is disposed.

16. The resistive memory device according to claim 13, wherein the second write path forms a current path from a column line to a row line between which the cell is disposed.

17. The resistive memory device according to claim 13, wherein the first write path and the second write path are controlled in response to different control signals.

18. The resistive memory device according to claim 17, wherein the control signals configured to a first control signal for controlling the first write path and a second control signal for controlling the second write path, and
wherein the second control signal is an inverted signal of the first control signal.

19. The method according to claim 1, further comprising:
determining whether or not the target data is written in the cell through an additional data verification after the performing of the additional write operation.

20. The method according to claim 8, further comprising:
additionally verifying whether or not the target data is written in the cell after the performing of the additional write operation.

* * * * *